United States Patent
Higashi et al.

(10) Patent No.: US 10,049,905 B2
(45) Date of Patent: Aug. 14, 2018

(54) SUBSTRATE HEAT TREATMENT APPARATUS, SUBSTRATE HEAT TREATMENT METHOD, STORAGE MEDIUM AND HEAT-TREATMENT-CONDITION DETECTING APPARATUS

(71) Applicant: TOKYO ELECTRON LIMITED, Tokyo (JP)

(72) Inventors: Koudai Higashi, Koshi (JP); Shinichiro Misaka, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 292 days.

(21) Appl. No.: 14/861,135

(22) Filed: Sep. 22, 2015

(65) Prior Publication Data

US 2016/0093519 A1    Mar. 31, 2016

(30) Foreign Application Priority Data

Sep. 25, 2014  (JP) .................... 2014-195693
May 13, 2015  (JP) .................... 2015-098385

(51) Int. Cl.
  *H05B 3/68* (2006.01)
  *H01L 21/67* (2006.01)
  *H05B 1/02* (2006.01)

(52) U.S. Cl.
  CPC .. *H01L 21/67248* (2013.01); *H01L 21/67109* (2013.01); *H05B 1/0233* (2013.01)

(58) Field of Classification Search
  CPC .. H01L 21/67098–21/67109; H01L 21/67248; H01L 21/67288; H05B 1/0233
  (Continued)

(56) References Cited

U.S. PATENT DOCUMENTS 5,001,423 A * 3/1991 Abrami ............ G01R 31/2831
                                                      219/444.1
2009/0160472 A1* 6/2009 Segawa ............ G01R 31/2874
                                                      324/750.04
(Continued)

FOREIGN PATENT DOCUMENTS

JP    H01-245142 A1    9/1989
JP    2008-053454 A1   3/2008
(Continued)

OTHER PUBLICATIONS

Japanese Office Action (Application No. 2015-098385) dated Mar. 13, 2018 (with English translation).

*Primary Examiner* — Sang Y Paik
(74) *Attorney, Agent, or Firm* — Burr & Brown, PLLC

(57) ABSTRACT

A substrate heat treatment apparatus includes: a placement unit on which a substrate is placed; a heat treatment unit for heating or cooling the substrate on the placement unit; a plurality of temperature sensors positioned correspondingly to a plurality of locations of the substrate on the placement unit; and a control unit. The control unit is configured to control the heat treatment unit based on temperatures detected by the temperature sensors, to calculate a position of a thermal center of gravity of the substrate based on the temperatures detected by the temperature sensors, and to detect heat treatment condition of the substrate based on the position of the thermal center of gravity.

20 Claims, 11 Drawing Sheets

(58) Field of Classification Search
USPC .......................................... 219/443.1–468.2
See application file for complete search history.

(56) References Cited

U.S. PATENT DOCUMENTS

2009/0288425 A1* 11/2009 Phan ....................... H01L 23/34
                                                                                        62/3.3
2014/0192835 A1* 7/2014 Caroff ..................... H01L 23/34
                                                                                       374/15

FOREIGN PATENT DOCUMENTS

| JP | 2009-123816 | A1 | 6/2009 |
| JP | 2010-284641 | A1 | 12/2010 |

* cited by examiner

SUBSTRATE HEAT TREATMENT APPARATUS, SUBSTRATE HEAT TREATMENT METHOD, STORAGE MEDIUM AND HEAT-TREATMENT-CONDITION DETECTING APPARATUS

CROSS REFERENCE TO RELATED APPLICATIONS

This application is based upon and claims the benefit of priority from the prior Japanese Patent Applications No. 2014-195693 filed on Sep. 25, 2014, and No. 2015-098385 filed on May 13, 2015, the entire contents of which are incorporated herein by reference.

BACKGROUND OF THE INVENTION

1. Field of the Invention

The present disclosure relates to a substrate heat treatment apparatus, a substrate heat treatment method, a storage medium and a heat-treatment-condition detecting apparatus.

2. Description of Related Art

In manufacturing of a semiconductor device, a wafer is heat-treated in various process steps. In the heat treatment, it is necessary to reliably heat each portion of the wafer. JP2009-123816A discloses a heat treatment apparatus including anomaly detecting means that judges that the heat treatment condition is abnormal if an integration value of the difference between the surface temperature of a heat treatment plate and the set temperature of the heat treatment plate is not more than a predetermined threshold value. However, there is a possibility that the above heat treatment apparatus cannot detect partial anomaly.

SUMMARY OF THE INVENTION

The object of the present disclosure is to provide an apparatus, a method and a storage medium, which are capable of more reliably detecting anomaly of the heat treatment condition.

The substrate heat treatment apparatus according to this disclosure is a substrate heat treatment apparatus comprising: a placement unit on which a substrate is placed; a heat treatment unit for heating or cooling the substrate on the placement unit; a plurality of temperature sensors positioned correspondingly to a plurality of locations of the substrate on the placement unit; and a control unit configured to control the heat treatment unit based on temperatures detected by the temperature sensors, to calculate a position of a thermal center of gravity of the substrate based on the temperatures detected by the temperature sensors, and to detect heat treatment condition of the substrate based on the position of the thermal center of gravity.

According to the substrate heat treatment apparatus, the heat treatment condition of the substrate is detected based on the position of the thermal center of gravity. The position of the thermal center of gravity sensitively varies depending on partial anomaly of heat treatment condition. Thus, partial anomaly of heat treatment condition can be sensitively detected based on the position of the thermal center of gravity. As a result, anomaly of the heat treatment condition can be more reliably detected.

The control unit may be configured to calculate, as the position of a first thermal center of gravity, the position of the thermal center of gravity in a plane of the substrate, configured to calculate, as the position of a second thermal center of gravity, the position of the thermal center of gravity in a radial position of the substrate, and to detect the heat treatment condition of the substrate based on the positions of the first and second thermal center of gravity.

Although the position of the first thermal center of gravity sensitively varies in response to partial anomaly of the heat treatment condition, the position of the first thermal center of gravity is unlikely to vary in the case of anomaly of heat treatment condition in which the temperature distribution is point-symmetric with respect to the center of the wafer. Concrete examples of the cases causing such anomaly include a case where a central portion of a substrate float up from the placement unit, and a case where the entire peripheral portion of the substrate floats up from the placement unit uniformly, etc. On the other hand, the position of the second thermal center of gravity varies depending on the temperature distribution along the radial direction of the substrate. Thus, since the heat treatment condition of the substrate is detected based both on the positions of the first and the second thermal center of gravity, anomaly of the heat treatment condition can be more reliably detected.

The control unit may be configured to calculate the position of the second thermal center of gravity, by regarding an average value of the temperature data detected by the temperature sensors whose radial positions are identical to each other, as only one temperature datum at the corresponding radial position. The control unit may be configured to calculate the second position of center of gravity, by regarding an average value of the temperature data detected by the temperature sensors in each of annular areas, which are concentric with the substrate and arranged in different radial positions, as only one temperature datum in the annular area. In these cases, the position of the second thermal center of gravity can be calculated precisely.

The control unit may be configured to use a reference position that is determined based on the position of the thermal center of gravity when the substrate is normally heat-treated, and configured to detect the heat treatment condition of the substrate based on a difference between the position of the thermal center of gravity and the reference position.

In this case, the heat treatment condition of the substrate is detected based on a component of the position of the thermal center of gravity remote from the reference position. Using the component remote from the reference position, the judgment standard for judging whether the heat treatment condition is normal or abnormal can be simplified.

The control unit may be configured to use, as the reference position, an average value of the positions of the thermal center of gravity, which is calculated in normal heat treatments of plural times, configured to use an allowable range determined based on a standard deviation of the positions of the thermal center of gravity, which is calculated in normal heat treatments of plural times, and configured to detect that the heat treatment condition of the substrate is abnormal when the difference between the position of the thermal center of gravity and the reference position is out of the allowable range.

In this case, based on the simple judgmental standard as to whether or not the position of the thermal center of gravity is positioned within the allowable range, anomaly of heat treatment condition can be detected. In addition, if the average value is used as the reference value and the allowable range determined based on the standard deviation is used, unnecessary anomaly detection can be reduced while allowing appropriate dispersion.

The control unit may be configured to output information related to the position of the thermal center of gravity.

It is possible to identify in which direction anomaly of heat treatment condition occurs, based on the position of the thermal center of gravity. Thus, by outputting information related to the position of the thermal center of gravity, there can be provided information which is useful to identify the position at which anomaly of heat treatment condition is caused.

The control unit may be configured to output trajectory information of the difference between the position of the thermal center of gravity and the reference position.

In this case, there is outputted trajectory information of a component of the position of the thermal center of gravity remote from the reference position. It is possible to more easily know in which direction anomaly of heat treatment condition occurs, based on the trajectory information of the component remote from the reference position. Thus, there can be provided information which is useful to identify the position at which anomaly of heat treatment condition is caused.

The heat treatment unit may be capable of independently controlling the heat treatment condition of a plurality of treatment areas arranged in a plane of the substrate, and the control unit may be configured to identify a treatment area in which the heat treatment is insufficient based on the position of the thermal center of gravity, and configured to control the heat treatment unit in order to promote the heat treatment in the treatment area.

In this case, since the heat treatment is performed depending on the information of the position of the thermal center of gravity, reliability of the heat treatment can be improved.

The control unit may be configured to calculate the position of the thermal center of gravity by the following expressions (1) and (2):

$$X = \frac{\sum_{i=1}^{n} xi \cdot Ti}{\sum_{i=1}^{n} Ti} \quad (1)$$

$$Y = \frac{\sum_{i=1}^{n} yi \cdot Ti}{\sum_{i=1}^{n} Ti} \quad (2)$$

where:

"X" and "Y" are coordinate values indicating the position of the thermal center of gravity in orthogonal coordinate system;

"xi" and "yi" are coordinate values indicating the position of the temperature sensor in the orthogonal coordinate system;

"Ti" is the temperature detected by each temperature sensors; and

"n" is the number of the temperature sensors.

The substrate heat treatment apparatus according to this disclosure is a substrate heat treatment method comprising: placing a substrate on a placement unit; heating or cooling the substrate on the placement unit by a heat treatment unit; detecting temperatures by a plurality of temperature sensors positioned correspondingly to a plurality of locations of the substrate on the placement unit; controlling the heat treatment unit based on the temperatures detected by the temperature sensors; calculating a position of a thermal center of gravity, which corresponds to a center of gravity on the assumption that the temperatures detected by the temperature sensors are regarded as weights, based on the temperatures detected by the temperature sensors; and detecting heat treatment condition of the substrate based on the position of the thermal center of gravity.

According to the substrate heat treatment method, heat treatment condition of a substrate is detected based on a position of a thermal center of gravity. The position of the thermal center of gravity sensitively varies depending on partial anomaly of heat treatment condition. Thus, partial anomaly of heat treatment condition can be sensitively detected based on the position of the thermal center of gravity. As a result, anomaly of the heat treatment condition can be more reliably detected.

The position of the thermal center of gravity in a plane of the substrate may be calculated as the position of a first thermal center of gravity, and the position of the thermal center of gravity in a radial position of the substrate may be calculated as the position of a second thermal center of gravity, and the heat treatment condition of the substrate may be detected based on the positions of the first and second center of gravity.

Although the position of the first thermal center of gravity sensitively varies in response to partial anomaly of the heat treatment condition, the position of the first thermal center of gravity is unlikely to vary in the case of anomaly of heat treatment condition in which the temperature distribution is point-symmetric with respect to the center of the wafer. Concrete examples of the cases causing such anomaly include a case where a central portion of a substrate float up from the placement unit, and a case where the entire peripheral portion of the substrate floats up from the placement unit uniformly, etc. On the other hand, the position of the second thermal center of gravity varies depending on the temperature distribution along the radial direction of the substrate. Thus, since the heat treatment condition of the substrate is detected based both on the positions of the first and the second thermal center of gravity, anomaly of the heat treatment condition can be more reliably detected.

The position of the second thermal center of gravity may be calculated by regarding an average value of the temperature data detected by the temperature sensors whose radial positions are identical to each other, as only one temperature datum at the corresponding radial position. The position of the second thermal center of gravity may be calculated by regarding an average value of the temperature data detected by the temperature sensors in each of annular areas, which are concentric with the substrate and arranged in different radial positions, as only one temperature datum in the annular area.

In these cases, the position of the second thermal center of gravity can be calculated precisely.

A reference position may be used, which is determined based on the position of the thermal center of gravity when the substrate is normally heat-treated, and the heat treatment condition of the substrate is detected based on a difference between the position of the thermal center of gravity and the reference position.

In this case, the heat treatment condition of the substrate is detected based on a component of the position of the thermal center of gravity remote from the reference position. Using the component remote from the reference position, the judgment standard for judging whether the heat treatment condition is normal or abnormal can be simplified.

An average value of the positions of the thermal center of gravity, which is calculated in normal heat treatments of plural times, may be used as the reference position; an allowable range determined based on a standard deviation of the positions of the thermal center of gravity, which is calculated in normal heat treatments of plural times, may be further used; and when a difference between the position of the thermal enter of gravity and the reference position is out of the allowable range, the heat treatment condition of the substrate may be detected as abnormal.

In this case, based on the simple judgmental standard as to whether or not the position of the thermal center of gravity is positioned within the allowable range, anomaly of heat treatment condition can be detected. In addition, since the average value is used as the reference value, and the allowable range determined based on the standard deviation is used, unnecessary anomaly detection can be reduced while allowing appropriate dispersion.

The substrate heat treatment method may further include outputting information related to the position of the thermal center of gravity.

It is possible to identify in which direction anomaly of heat treatment condition occurs, based on the position of the thermal center of gravity. Thus, by outputting information related to the position of the thermal center of gravity, there can be provided information which is useful to identify the position at which anomaly of heat treatment condition is caused.

The substrate heat treatment method may further comprise outputting trajectory information of a difference between the position of the thermal center of gravity and the reference position.

In this case, there is outputted trajectory information of a component of the position of the thermal center of gravity remote from the reference position. It is possible to more easily know in which direction anomaly of heat treatment condition occurs, based on the trajectory information of the component remote from the reference position. Thus, there can be provided information which is useful to identify the position at which anomaly of heat treatment condition is caused.

The substrate heat treatment method may further include identifying a treatment area in which the heat treatment is insufficient based on the position of the thermal center of gravity, and controlling the heat treatment unit in order to promote the heat treatment in the treatment area.

In this case, since the heat treatment is performed depending on the information of the position of the thermal center of gravity, reliability of the heat treatment can be improved.

The position of the thermal center of gravity may be calculated by the aforementioned expressions (1) and (2).

The recording medium according to this disclosure is a computer-readable storage medium storing a program for causing an apparatus to execute the aforementioned substrate heat treatment method.

The heat-treatment-condition detecting apparatus according to this disclosure is a heat-treatment-condition detecting apparatus configured to obtain temperatures detected by a plurality of temperature sensors positioned correspondingly to a plurality of locations of a substrate to be heat-treated on a placement unit, to calculate a position of a thermal center of gravity which corresponds to a center of gravity on the assumption that the temperatures are regarded as weights, and to detect heat treatment condition of the substrate based on the position of the thermal center of gravity.

DETAILED DESCRIPTION OF THE INVENTION

Figure 1:
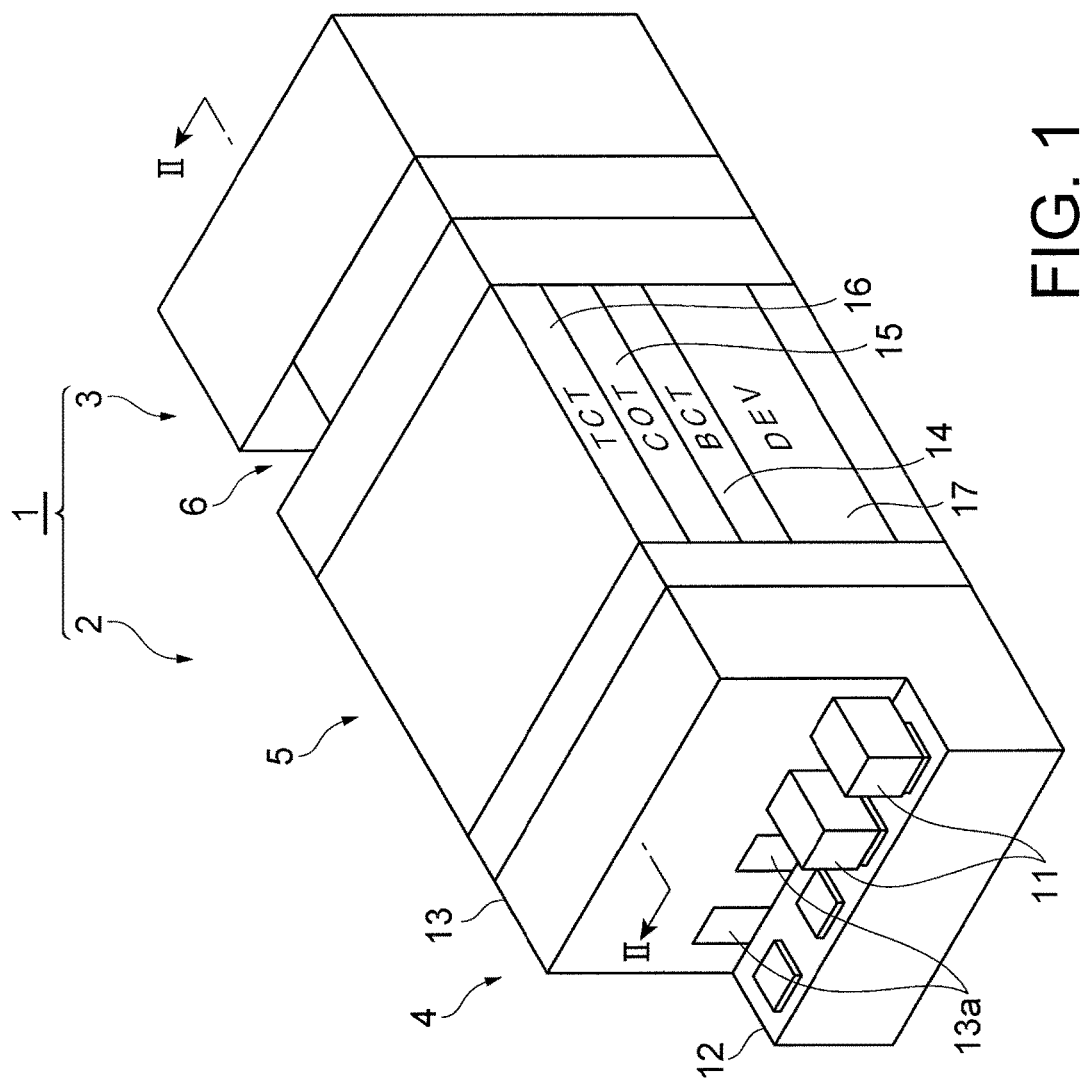
FIG. 1 is a perspective view of a coating and developing system.

Embodiments will be described in detail herebelow, with reference to the drawings. In the below description, the same elements or elements having the same function are shown by the same reference numerals, and duplicative explanation is omitted.

<Substrate Treatment System>

Firstly, the outline of a substrate treatment system 1 in this embodiment is described. The substrate treatment system 1 includes a coating and developing apparatus 2 and an exposure apparatus 3. The exposure apparatus 3 is configured to expose a resist film (which is a photosensitive coating film). Specifically, the exposure apparatus 3 irradiates energy rays to a part to be exposed of the resist film, by a liquid immersion exposure or the like. The coating and developing apparatus 2 is configured to form a resist film on a surface of a wafer W (substrate) before the exposure process to be performed by the exposure apparatus 3, and is configured to develop the resist film after the exposure process.

Figure 2:
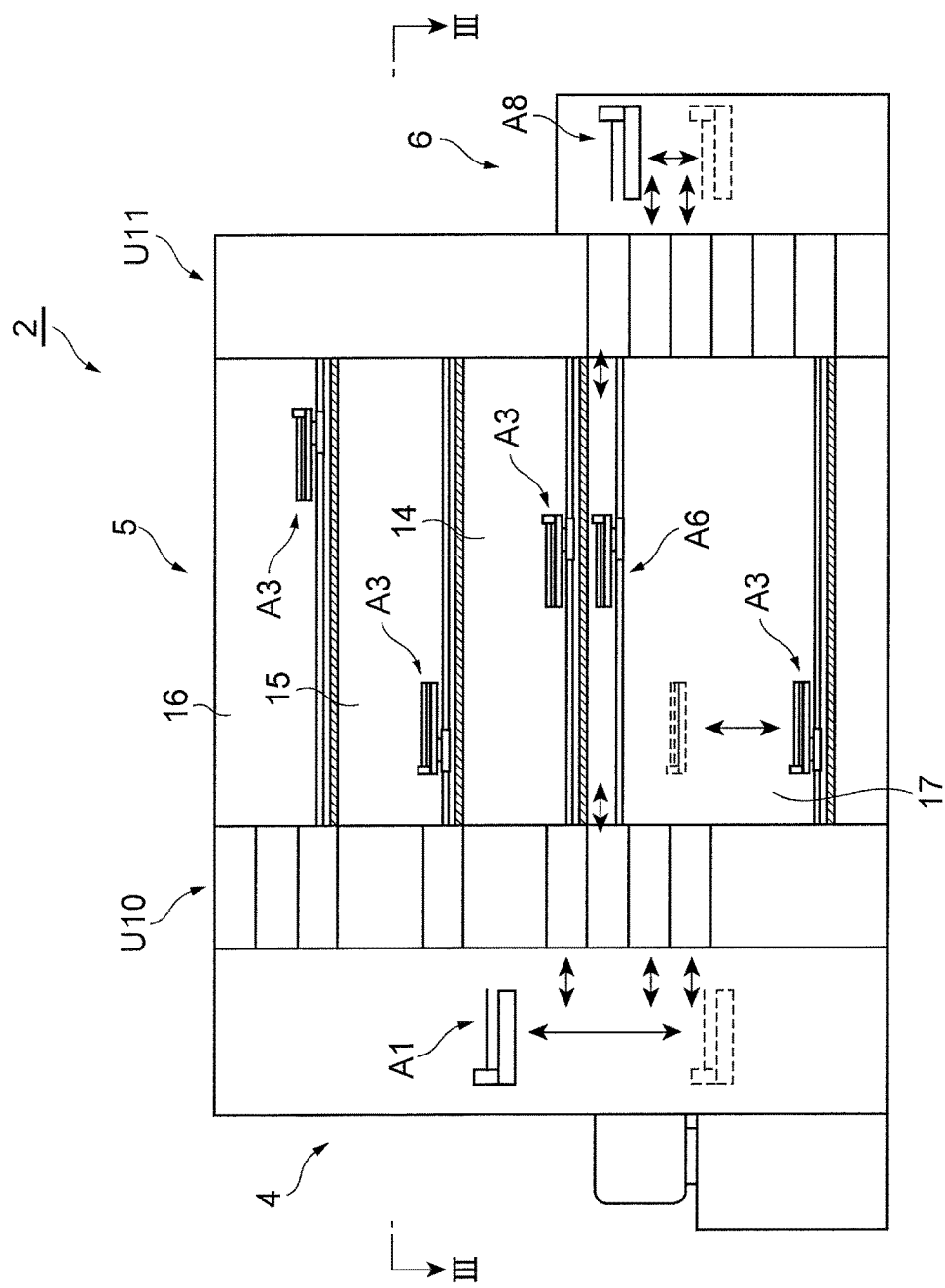
FIG. 2 is a sectional view taken along the line II-II in FIG. 1.

As shown in FIGS. 1 and 2, the coating and developing apparatus 2 includes a carrier block 4, a treatment block 5 and an interface block 6. The carrier block 4, the treatment block 5 and the interface block 6 are arranged in a horizontal direction.

The carrier block 4 includes a carrier station 12 and a loading/unloading unit 13. The loading/unloading unit 13 is interposed between the carrier station 12 and the treatment block 5. The carrier station 12 is configured to support a plurality of carriers 11. Each carrier 11 is configured to accommodate a plurality of circular wafers W in a hermetically sealed state, for example. The carrier 11 has, on one side 11a thereof, an opening/closing door through which wafers W are loaded and unloaded. The carrier 11 is detachably installed on the carrier station 12, such that the side surface 11a faces the loading/unloading unit 13.

The loading/unloading unit 13 has a plurality of opening/closing doors 13a which respectively correspond to the carriers 11 on the carrier station 12. By simultaneously opening the opening/closing door on the side surface 11a and the opening/closing door 13a, the inside of the carrier 11 and the inside of the loading/unloading unit 13 communicate with each other. The loading/unloading unit 13 has therein a delivery arm A1. The delivery arm A1 is configured to take out a wafer W from the carrier 11 and to deliver the wafer W to the treatment block, and is configured to receive a wafer W from the treatment block 5 and to return the wafer W into the carrier 11.

Figure 3:
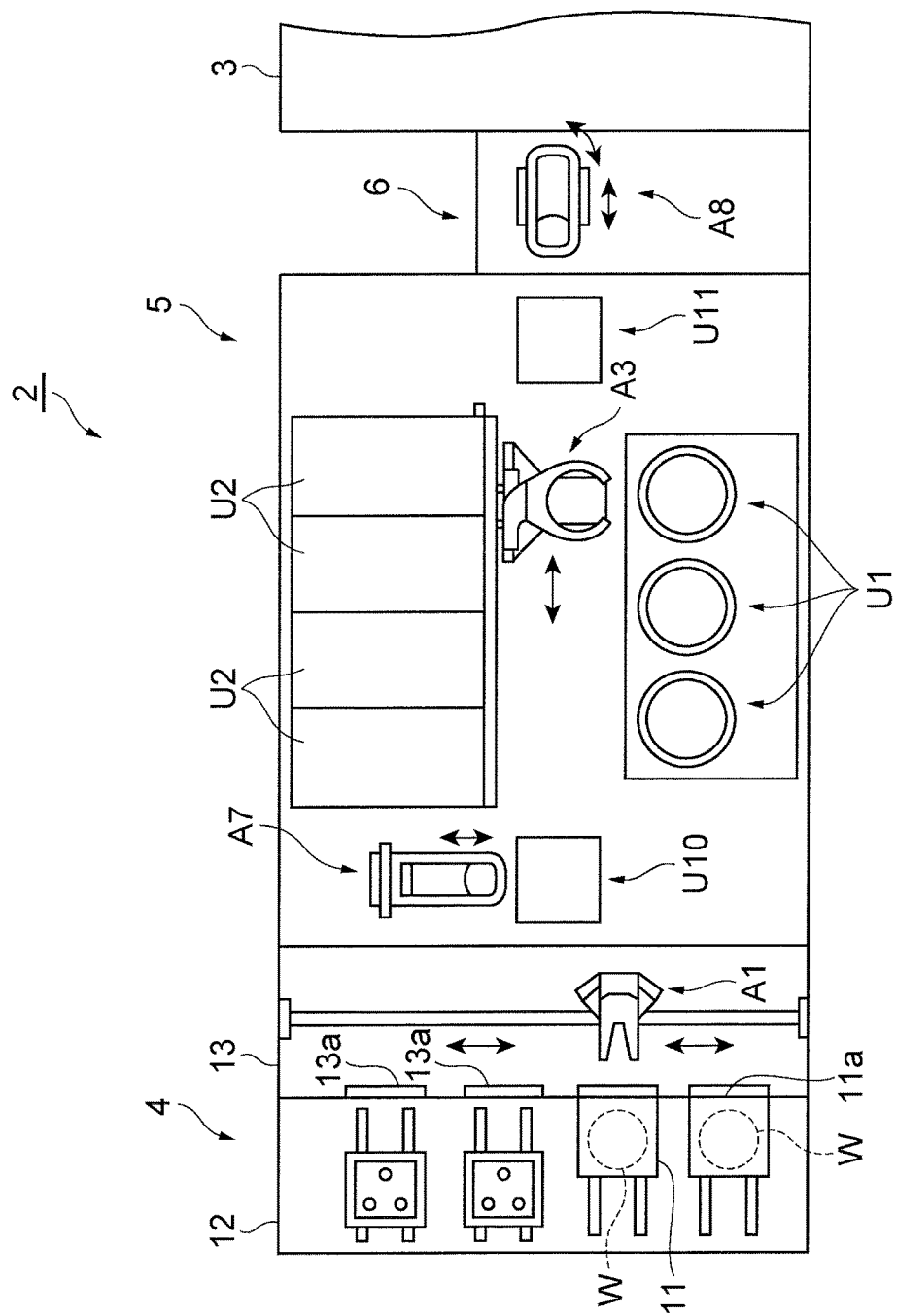
FIG. 3 is a sectional view taken along the line III-III in FIG. 2.

The treatment block 5 includes a plurality of treatment modules 14, 15, 16 and 17. As shown in FIGS. 2 and 3, the treatment modules 14, 15, 16 and 17 respectively include therein a plurality of liquid treatment units U1, a plurality of heat treatment units U2 and a transport arm A3 configured to transport a wafer W to these units. The treatment module 17 further has therein a direct transport arm A6 configured to transport a wafer W bypassing the liquid treatment units U1 and the heat treatment units U2. The liquid treatment unit U1 is configured to apply a liquid onto a surface of a wafer W. The heat treatment unit U2 is configured to perform a heat treatment to a wafer W by heating a wafer W by means of, e.g., a heating plate, and by cooling the heated wafer W by means of a cooling plate.

The treatment module 14 is a BCT module configured to form an underlayer film on a surface of a wafer W by the liquid treatment unit U1 and the heat treatment unit U2. The liquid treatment unit U1 of the treatment module 14 applies a liquid for forming an underlayer film onto a wafer W. The heat treatment unit U2 of the treatment module 14 is configured to perform various heat treatments for forming an underlayer film. A heating treatment for curing the liquid for forming the underlayer film can be taken as a concrete example of the heat treatments.

The treatment module 15 is a COT module configured to form a resist film on the underlayer film by the liquid treatment unit U1 and the heat treatment unit U2. The liquid treatment unit U1 of the treatment module 15 is configured to apply a liquid for forming a resist film onto the underlayer film. The heat treatment unit U2 of the treatment module 15 is configured to perform various heat treatments for forming the resist film. A heating treatment for curing the liquid for forming the resist film can be taken as a concrete example of the heat treatments.

The treatment module 16 is a TCT module configured to form an overlayer film on the resist film by the liquid treatment unit U1 and the heat treatment unit U2. The liquid treatment unit U1 of the treatment module 16 is configured to apply a liquid for forming an overlayer film onto the resist film. The heat treatment unit U2 of the treatment module 16 is configured to perform various heat treatments for forming the overlayer film. A heating treatment for curing the liquid for forming the overlayer film can be taken as a concrete example of the heat treatments.

The treatment module 17 is a DEV module configured to develop an exposed resist film by the liquid treatment unit U1 and the heat treatment unit U2. The liquid treatment model U1 of the treatment module 17 is configured to develop the resist film by applying a developing liquid onto the surface of the exposed wafer W and then by rinsing away the developing liquid with a rinse liquid. The heat treatment unit U2 of the treatment module 17 is configured to perform various heat treatments for developing the resist film. A heating treatment before the developing treatment (PEB: Post Exposure Bake) and a heating treatment after the developing treatment (PB: Post Bake) can be taken as concrete examples of the heat treatments.

In the treatment block 5, a shelf unit U10 is disposed on the side of the carrier block 4, and a shelf unit U11 is disposed on the side of the interface block 6. The shelf unit U10 extends from a floor surface up to the same level as that the treatment module 16, and is divided into a plurality of cells that are vertically arranged. An elevation arm A7 is provided near the shelf unit U10. The elevation arm A7 is configured to move upward and downward a wafer between the cells of the shelf unit U10. The shelf unit U11 extends from the floor surface up to the same level as that of the treatment module 17, and is divided into a plurality of cells that are vertically arranged.

The interface block 6 has therein a deliver arm A8, and is connected to the exposure apparatus 3. The delivery arm A8 delivers a wafer W placed on the shelf unit 11 to the exposure apparatus 3, and receives a wafer W from the exposure apparatus 3 and returns the wafer W to the shelf unit U11.

The substrate treatment system 1 performs a coating and developing process according to the following procedure. Firstly, the delivery arm A1 transports a wafer W in the carrier 11 to the shelf unit U10. The elevation arm A7 places the wafer W in the cell for the treatment module 14, and the transport arm A3 transports the wafer W to each unit in the treatment module 14. The liquid treatment unit U1 and the heat treatment unit U2 of the treatment module 14 form an underlayer film on a surface of the wafer W, which has been transported by the transport arm A3. After the formation of the underlayer film has been completed, the transport arm A3 returns the wafer W to the shelf unit U10.

Then, the elevation arm A7 places the wafer W, which has been returned to the shelf unit U10, in the cell for the treatment module 15, and the transport arm A3 transports the wafer W to each unit in the treatment module 15. The liquid treatment unit U1 and the heat treatment unit U2 of the treatment module 15 form a resist film on the underlayer film of the wafer W, which has been transported by the transport arm A3. After the formation of the resist film has been completed, the transport arm A3 returns the wafer W to the shelf unit U10.

Then, the elevation arm A7 places the wafer W, which has been returned to the shelf unit U10, in the cell for treatment module 16, and the transport arm A3 transports the wafer W to each unit in the treatment module 16. The liquid treatment unit U1 and the heat treatment unit U2 of the treatment module 16 form an overlayer film on the resist film of the wafer W, which has been transported by the transport arm A3. After the formation of the overlayer film has been completed, the transport arm A3 returns the wafer W to the shelf unit U10.

Then, the elevation arm A7 places the wafer W, which has been returned to the shelf unit U11, in the cell for treatment module 17, and the direct transport arm A6 transports the wafer W to the shelf unit U11. The delivery arm A8 delivers the wafer W to the exposure apparatus 3. After the exposure process in the exposure apparatus 3 has been completed, the delivery arm A8 receives the wafer W from the exposure apparatus 3, and returns the wafer W to the shelf unit U11.

Then, the transport arm A3 of the treatment module 17 transports the wafer W, which has been returned to the shelf unit U11, to each unit in the treatment module 17. The liquid treatment unit U1 and the heat treatment unit U2 of the treatment module 17 perform a developing process of the resist film of the wafer W, which has been transported by the transport arm A3, and a heating process related to the developing process. After the development of the resist film has been completed, the transport arm A3 transports the wafer W to the shelf unit U10.

Then, the elevation arm A7 places the wafer W, which has been transported to the shelf unit U10, in the cell for delivery, and the delivery arm A1 returns the wafer W into the carrier 11. The coating and developing process is thus completed.

<Substrate Heat Treatment Apparatus>

Figure 4:
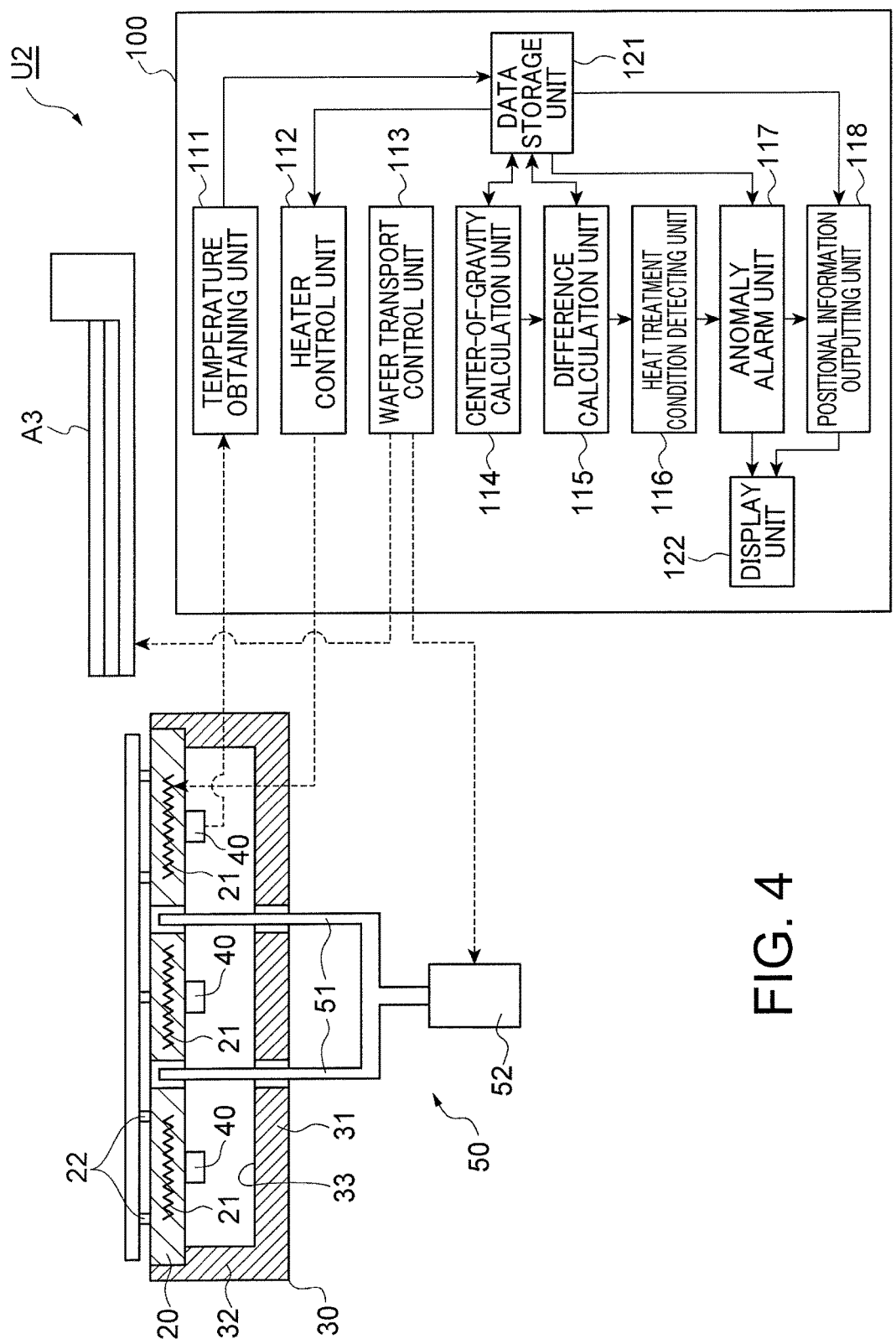
FIG. 4 is a schematic diagram of a heat treatment unit.

Next, as an embodiment of the substrate heat treatment apparatus, the heat treatment unit U2 is described in detail. As shown in FIG. 4, the heat treatment unit U2 includes a heating plate 20, a support base 30, a plurality of temperature sensors 40, an elevation mechanism 50 and a control section 100.

Figure 5:
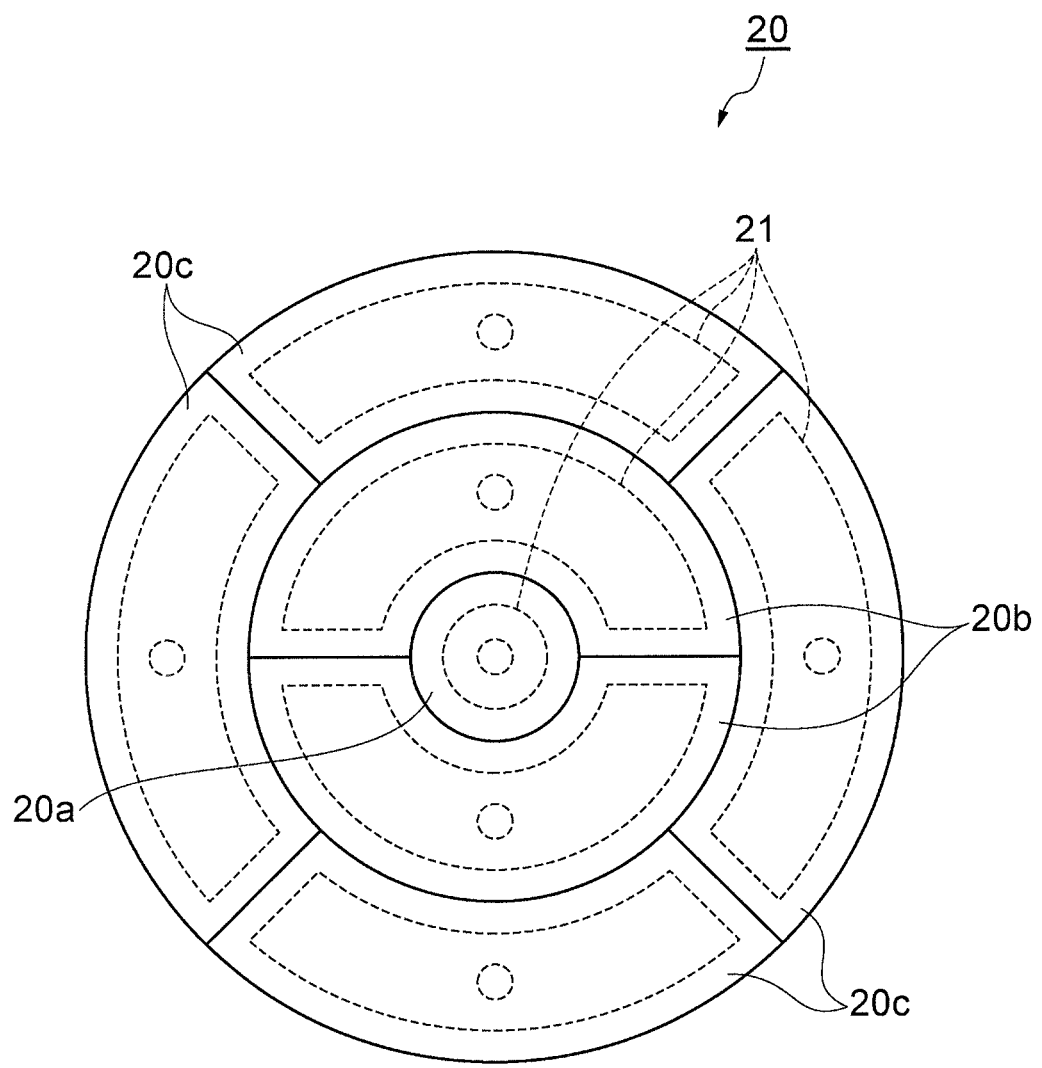
FIG. 5 is a plan view of a heating plate.

The heating plate 20 has a discoid shape, and contains a plurality of built-in heaters 21. The heating plate 20 serves as a placement unit on which a wafer W is placed, and the heater 21 functions as a heat treatment unit for heating the wafer W placed on the placement unit. The heating plate 20 is divided into a plurality of areas in plan view, and the heaters 21 are disposed in the respective areas. FIG. 5 is a plan view showing an example of arrangement of the heaters 21. The heating plate 20 shown in FIG. 5 is divided into seven areas in total: a central area 20a, two areas 20b surrounding the area 20a, and four areas 20c surrounding the areas 20b. The heating plate 20 has therein seven heaters in total, each of which is disposed in respective ones of the areas 20a, 20b and 20c.

A plurality of proximity pins 22 are distributed on the heating plate 20 along an upper surface of the heating plate 20. The proximity pins 22 support a wafer W placed on the heating plate 20 such that a gap is defined between the heating plate 20 and the wafer W.

The support base 30 includes a bottom plate 31 and a peripheral wall 32. The bottom plate 31 is opposed to the heating plate 20. The peripheral wall 32 is provided along the periphery of the bottom plate 31 so as to support the peripheral part of the heating plate 20. A hollow space 33 is formed between the the support base 30 and the the heating plate 20 supported by the peripheral wall 32.

The temperature sensors 40 are positioned correspondingly to a plurality of positions on the wafer W placed on the heating plate 20. Namely, the temperature sensors 40 are distributed within a plane opposed to the wafer W on the heating plate 20. For example, the temperature sensors 40 are attached to a lower surface of the heating plate 20 in the hollow space 33. In the embodiment shown in FIG. 5, seven temperatures sensors 40 are provided in respective ones of the areas 20a, 20b and 20c, and each of the temperature sensors 40 is disposed below the corresponding heaters 21.

It is not necessary that the temperature sensors 40 are positioned as described above, as long as the temperature sensors 40 are disposed correspondingly to predetermined positions within the wafer W. For example, the temperature sensors 40 do not necessarily have to be attached to the lower surface of the heating plate 20. Instead, the temperature sensors 40 may be built in the heating plate 20, together with the heaters 21. It is not absolutely necessary that the temperature sensors 40 are positioned in each of the areas 20a, 20b and 20c.

The elevation mechanism 50 includes a plurality of (e.g., three) elevation pins 51 and a driving unit 52. The elevation pins 51 move upward and downward, passing through the bottom plate 31 and the heating plate 20. An upper part of each elevation pin 51 protrudes from the heating plate 20 when the elevation pin 51 is moved upward, and is retracted into the heating plate 20 when the elevation pin 51 is moved downward. The driving unit 52 has therein a driving source such as a motor or an air cylinder so as to move upward and downward the elevation pins 51. By moving upward and downward the elevation pins 51, the elevation mechanism 50 moves upward and downward the wafer W on the heating plate 20.

The control section 100 is configured: to control the heaters 21 based on temperatures detected by the temperature sensors 40; to calculate the position of a thermal center of gravity (the thermal center of gravity corresponds to a center of gravity on the assumption that the temperatures detected by the temperature sensors 40 are regarded as weights (mass)); and to detect heat treatment condition of a wafer W based on the position of the thermal center of gravity. The control section 100 constitutes a heat treatment condition detecting apparatus that is configured: to obtain temperatures detected by the temperature sensors 40; to calculate the position of the thermal center of gravity, which corresponds to the center of gravity on the assumption that the temperatures are regarded as weights; and to detect heat treatment condition of the wafer W based on the position of the thermal center of gravity.

For example, the control section 100 includes a temperature obtaining unit 111, a heater control unit 112, a wafer-transport control unit 113, a center-of-gravity calculation unit 114, a difference calculation unit 115, a heat-treatment-condition detecting unit, an anomaly alarm unit 117, a positional information outputting unit 118, a data storage unit 121 and a display unit 122.

The temperature obtaining unit 111 obtains temperatures detected by the temperature sensors 40, and stores the temperature data in the data storage unit 121. The heater control unit 112 controls the heaters 21 based on the temperature data obtained by the obtaining unit 111 and stored in the data storage unit 121. The wafer-transport control unit 113 controls the transport arm A3 and the elevation mechanism 50 such that the wafer W is transported to the heating plate 20 and is placed thereon, and that the wafer W on the heating plate 20 is transported therefrom.

The center-of-gravity calculation unit 114 calculates the position of the thermal center of gravity based on the temperature data stored in the data storage unit 121, and stores the calculation result in the data storage unit 121. The difference calculation unit 115 obtains the position of the thermal center of gravity stored in the data storage unit 121, calculates the difference between the position of the thermal center of gravity and a reference position, and stores the calculation result in the data storage unit 121. For example, the reference position is determined based on the position of the center of gravity on the assumption that the wafer W is normally heat-treated. The heat-treatment-condition detecting unit 116 detects the heat treatment condition of the wafer W, based on the difference between the position of the thermal center of gravity and the reference position.

The anomaly alarm unit 117 outputs information to the display unit 122 information to report anomaly in the heat treatment condition. The positional information output unit 118 outputs, to the display unit 122, information related to the position of the thermal center of gravity. The display unit 122 outputs information, which has been outputted from the anomaly alarm unit 117 and the positional information output unit 118, as a display image.

The control section 100 is formed of one or more control computers, for example. In this case, the foregoing units of the control section 100 are composed of a processor, a memory, a monitor, etc. of the control computer which are cooperated with each other. A program for causing the control computer to function as the control section 100 may be stored in a computer-readable recording medium. In this case, the recording medium stores a program for causing the apparatus to execute the below-described substrate heat treatment method. The computer-readable recording medium may be a hard disc, a compact disc, a flash memory, a flexible disc, a memory card or the like.

A hardware device forming the respective units of the control section 100 is not limited to the processor, the memory and the monitor. For example, each unit of the control section 100 may be formed of an electric circuit specialized for its function, or an ASIC (Application Specific Integrated Circuit) in which the electric circuits are integrated.

The control section 100 may be divided into a plurality of hardware devices. For example, the control section 100 may be divided into a hardware device for controlling the heat treatment unit U2 and a hardware device forming the heat-treatment-condition detection apparatus. These hardware devices may be connected by wired or wireless connection. These hardware devices may be disposed apart from each other, and may be connected through a network.

<Substrate Heat Treatment Method>

Next, as an example of the substrate heat treatment method, a heat treatment procedure of a wafer W by the heat treatment unit U2 is described.

Figure 6:
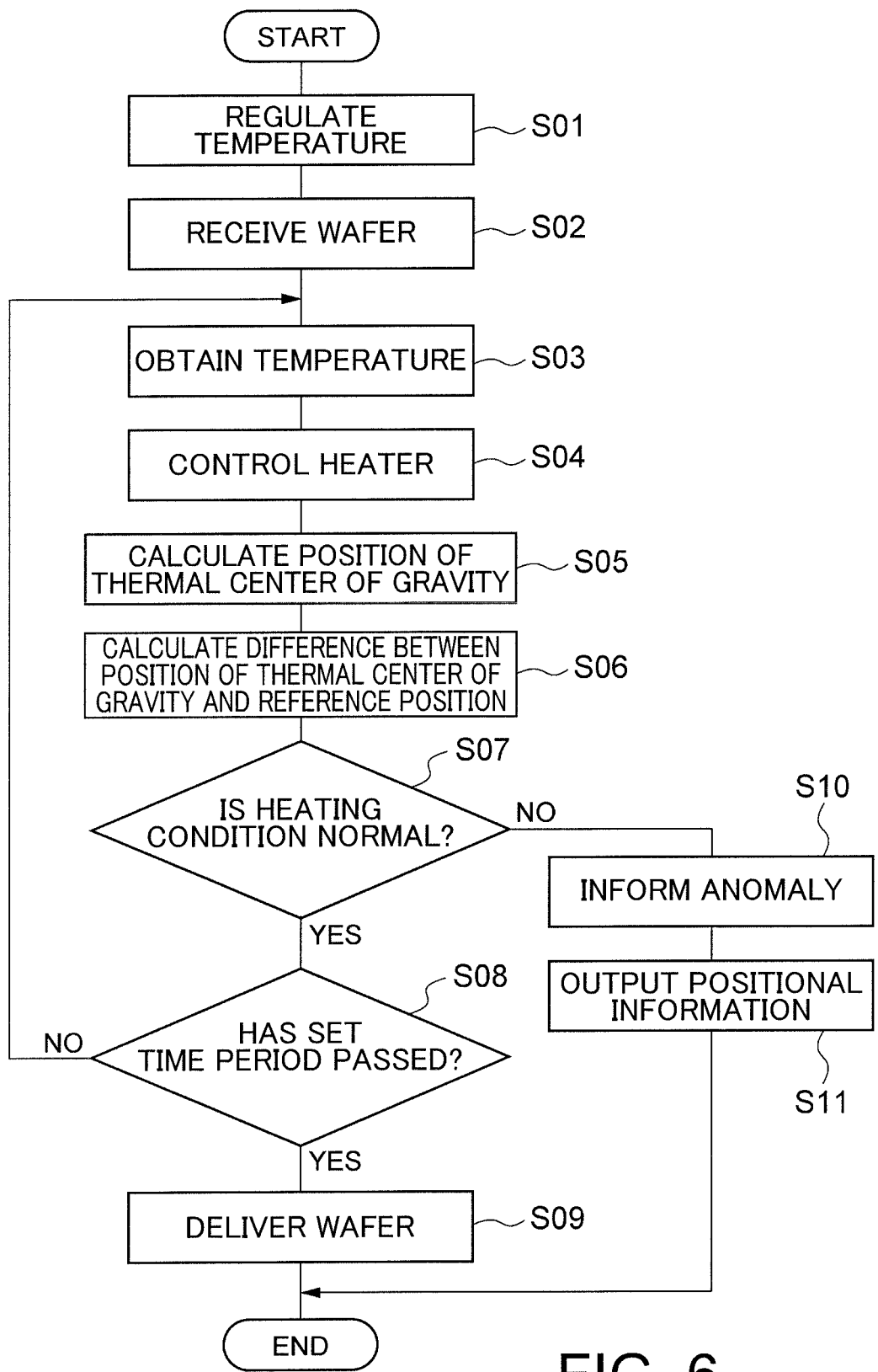
FIG. 6 is a flowchart showing a wafer heat treatment procedure performed by the heat treatment unit.

As shown in FIG. 6, the control section 100 firstly performs a step S01. In the step S01, the temperature obtaining unit 111 obtains temperatures detected by the plurality of temperature sensors 40. The heater control unit 112 controls the plurality of heaters 21, based on the temperatures obtained by the temperature obtaining unit 111. Specifically, the heater control unit 112 regulates power to be supplied to the heaters 21, such that the temperatures detected by the temperature sensors 40 come close to a target value.

Then, the control section 100 performs a step S02. In the step S02, the transport arm A3 and the elevation mechanism 50 place the wafer W on the heating plate 20, in response to the control by the wafer-transport control unit 113. The wafer W placed on the heating plate 20 is heated by heat transferred from the heaters 21. Namely, the step S02 includes heating of the wafer W on the heating plate 20 by the heaters 21.

Then, the control section 100 performs steps S03 and S04. In the step S03, the temperature obtaining unit 111 obtains temperatures detected by the temperature sensors 40, and stores the temperature data in the data storage unit 121. In the step S04, the heater control unit 112 controls the heaters 21, based on the temperatures obtained by the temperature obtaining unit 111. Specifically, the heater control unit 112 controls power to be supplied to the heaters 21, such that the temperatures detected by the temperature sensors 40 come close to a target value.

Then, the control section 100 performs steps S05 and S06. In the step S05, the center-of-gravity calculation unit 114 calculates the position of a thermal center of gravity, and stores the calculation result in the data storage unit 121. The position of the thermal center of gravity can be calculated as a weighted average of coordinate values where temperature is used as "weight (mass)". For example, the center-of-gravity calculation unit 114 calculates, as the position of a first thermal center of gravity, the position of the thermal center of gravity (coordinate values) in a plane parallel to a surface of the wafer W. The position of the first thermal center of gravity can be calculated by the following expressions (1) and (2).

$$X = \frac{\sum_{i=1}^{n} x_i \cdot T_i}{\sum_{i=1}^{n} T_i} \quad (1)$$

$$Y = \frac{\sum_{i=1}^{n} y_i \cdot T_i}{\sum_{i=1}^{n} T_i} \quad (2)$$

where:
X, Y: the position (coordinate values) of a thermal center of gravity in orthogonal coordinate system;
xi, yi: the position (coordinate values) of the temperature sensor in the orthogonal coordinate system;
Ti: temperature detected by the temperature sensor; and
n: the number of the temperature sensors.

In the step S06, the difference calculation unit 115 obtains the position of the thermal center of gravity stored in the data storage unit 121, calculates the difference between the position of the thermal center of gravity and a reference position, and stores the calculation result in the data storage unit 121. As described above, the reference position is determined based on the position of the thermal center of gravity calculated when the wafer W is normally heat-treated.

As a concrete example of the reference position may be an average of positions of the thermal center of gravity that have been calculated in the past previous normal heat treatments. The reference position is recorded in advance in the data storage unit 121, for example. The reference position may be calculated by the difference calculation unit 115 or the like, prior to the step S06. Namely, the control section 100 may be configured to further perform calculation of the reference position. The substrate heat treatment method may further include calculation of the reference position.

Then, the control section 100 preforms a step S07. In the step S07, the heat-treatment-condition detecting unit 116 detects heat treatment condition of the wafer W, based on the position of the thermal center of gravity. The detection of the heat treatment condition may be detection of whether the heat treatment condition is normal or abnormal. For example, the heat-treatment-condition detecting unit 116 detects that the heat treatment condition of the wafer W is normal, when the difference between the position of the thermal center of gravity and the reference position is within an allowable range. On the other hand, the heat-treatment-condition detecting unit 116 detects that the heat treatment condition of the wafer W is abnormal, when the difference between the position of the thermal center of gravity and the reference position is out of the allowable range.

A concrete example of the allowable range may be a standard deviation of positions of the thermal center of gravity that have been calculated in the past normal heat treatments. The allowable range may be obtained by multiplying the standard deviation by a predetermined multiplying factor (e.g., three). The allowable range is recorded in advance in the data storage unit 121, for example. The allowable range may be calculated by the heat-treatment-condition detecting unit 116 or the like, prior to the step S07. Namely, the control section 100 may be configured to further perform calculation of the allowable range. The substrate heat treatment method may further include calculation of the allowable range.

When the fact that the heat treatment condition is normal is detected in the step S07, the control section 100 performs a step S08. In the step S08, the wafer-transport control unit 113 detects whether or not a set time period has passed from the starting of heating of the wafer W. If the fact that the set time period has not yet passed in the step S08, the program returns to the step S03 by the control section 100. If the fact that the set time period has passed in the step S08, the control unit performs a step S09. In the step S09, the transport arm A3 and the elevation mechanism 50 transport the wafer W on the heating plate 20 therefrom, in response to the control by the wafer-transport control unit 113. The normal heat treatment of the wafer W is thus completed.

When the fact that the heat treatment condition of the wafer W is abnormal is detected in the step S07, the control section 100 performs steps S10 and S11. In the step S10, the anomaly alarm unit 117 outputs, to the display unit 122, information announcing the anomaly of the heat treatment condition, and the display unit 122 outputs the information as a display image. In the step S11, the positional information output unit 118 outputs, to the display unit 122, information related to the position of the thermal center of gravity, and the display unit 122 outputs the information as a display image.

For example, based on the data accumulated in the data storage unit 121 by repeating the steps S03 to S08, the positional information output unit 118 outputs trajectory information of the difference between the position of the thermal center of gravity and the reference position, and the display unit 122 outputs the information as a graph. The term "trajectory information" means information indicating chronological change of the position (including the position difference). Data showing position data accumulated in the data storage unit 121 by repeating the steps S03 to S08 in chronological order falls under the "trajectory information".

After the control section 100 has performed the steps S10 and S11, the control section 100 finishes the heat treatment.

The heat treatment unit U2 as described above includes the heating plate 20 on which the wafer W is placed, the heaters 21 for heating the wafer W on the placement unit, the temperature sensors 40 positioned correspondingly to a plurality of locations of the wafer W on the heating plate 20, and the control section 100. The control section 100 is configured to: control the heaters 21 based on the temperatures detected by the temperature sensors 40; to calculate the position of the thermal center of gravity, which corresponds to a center of gravity on the assumption that the temperatures detected by the temperature sensors 40 are regarded as weights; and to detect heat treatment condition of the wafer W based on the position of the thermal center of gravity.

With the heat treatment unit U2, heat treatment condition the wafer W can be detected based on the position of the thermal center of gravity. The heat treatment condition of the whole wafer W may be abnormal, while the heat treatment condition of only a limited part or parts of the wafer W may also be abnormal (hereinafter referred to as "partial anomaly of heat treatment condition"). One of the reasons for causing the partial anomaly of heat treatment condition may be that a part of the wafer W is spaced away from the heating plate 20 (hereinafter referred to as "floating-up of wafer W") as compared with the normal placement condition. The floating-up of the wafer W may occur because of placement of the wafer W on small particles, or because of warp of a wafer W and so on. As described below, the position of the thermal center of gravity varies sensitively, depending on partial anomaly of heat treatment condition.

Figure 7:
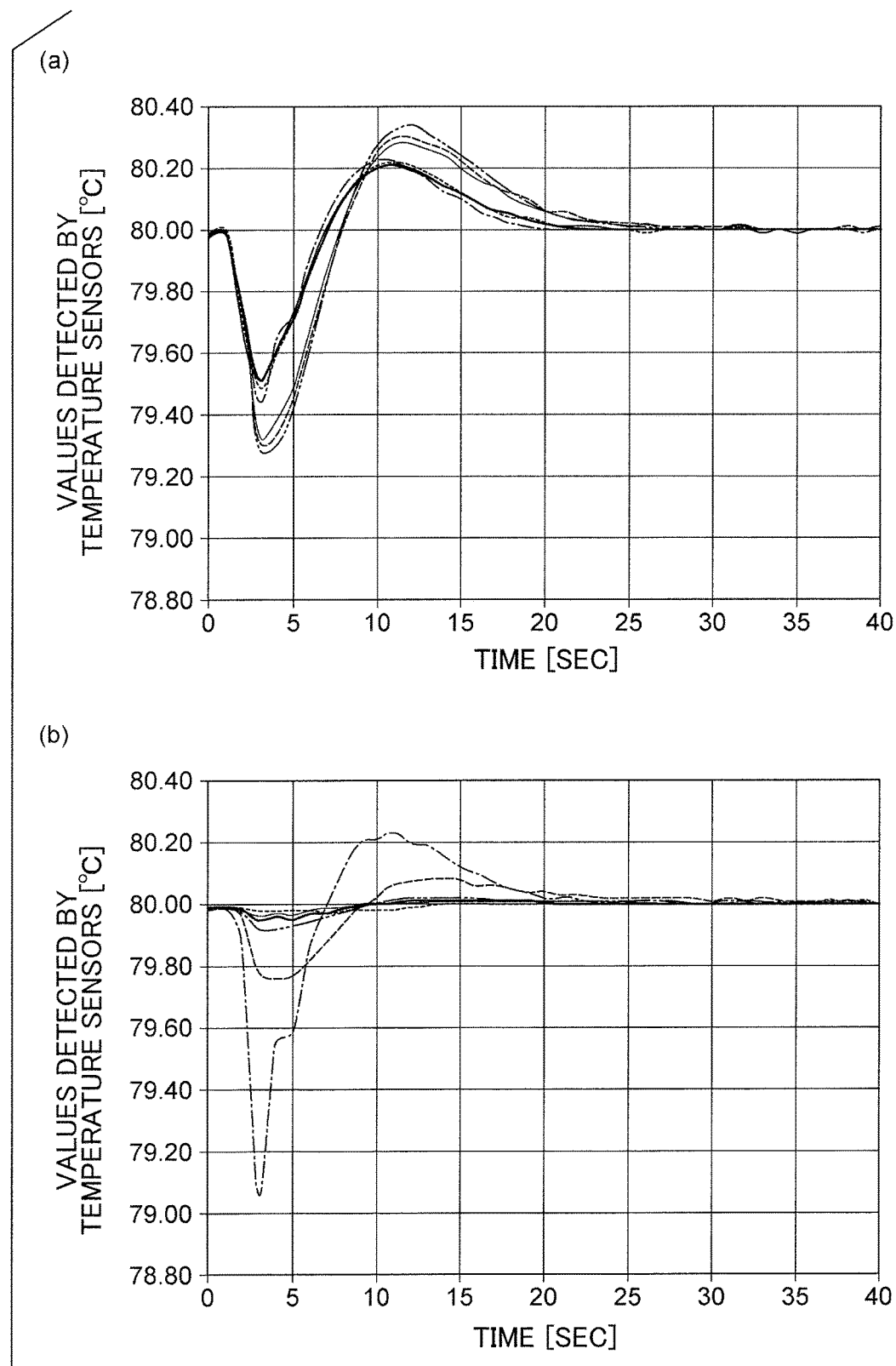
FIG. 7 is a graph showing, by way of example, a chronological temperature change during a heat treatment.

FIG. 7(a) is a graph showing the chronological change of temperatures detected by the temperature sensors 40, when the heating of the wafer W by the heating plate 20 shown in FIG. 5 is normally performed. FIG. 7(b) is a graph showing the chronological change of temperatures detected by the temperature sensors 40, when the heating of the wafer W is performed with the wafer W floats up from the upper half of the heating plate 20 shown in FIG. 5. Both in FIGS. 7(a) and 7(b), the detected values of the respective temperature sensors 40 change so as to gradually come close to the set temperature, after the temperatures once lowered upon starting of heating. The lowering of temperatures after the starting of heating is caused because the heat of the heaters 20 is absorbed by the wafer W. The reason why the lowered temperatures return to the set temperature is that the heaters 21 are controlled based on the temperatures detected by the temperature sensors 40.

Figure 8:
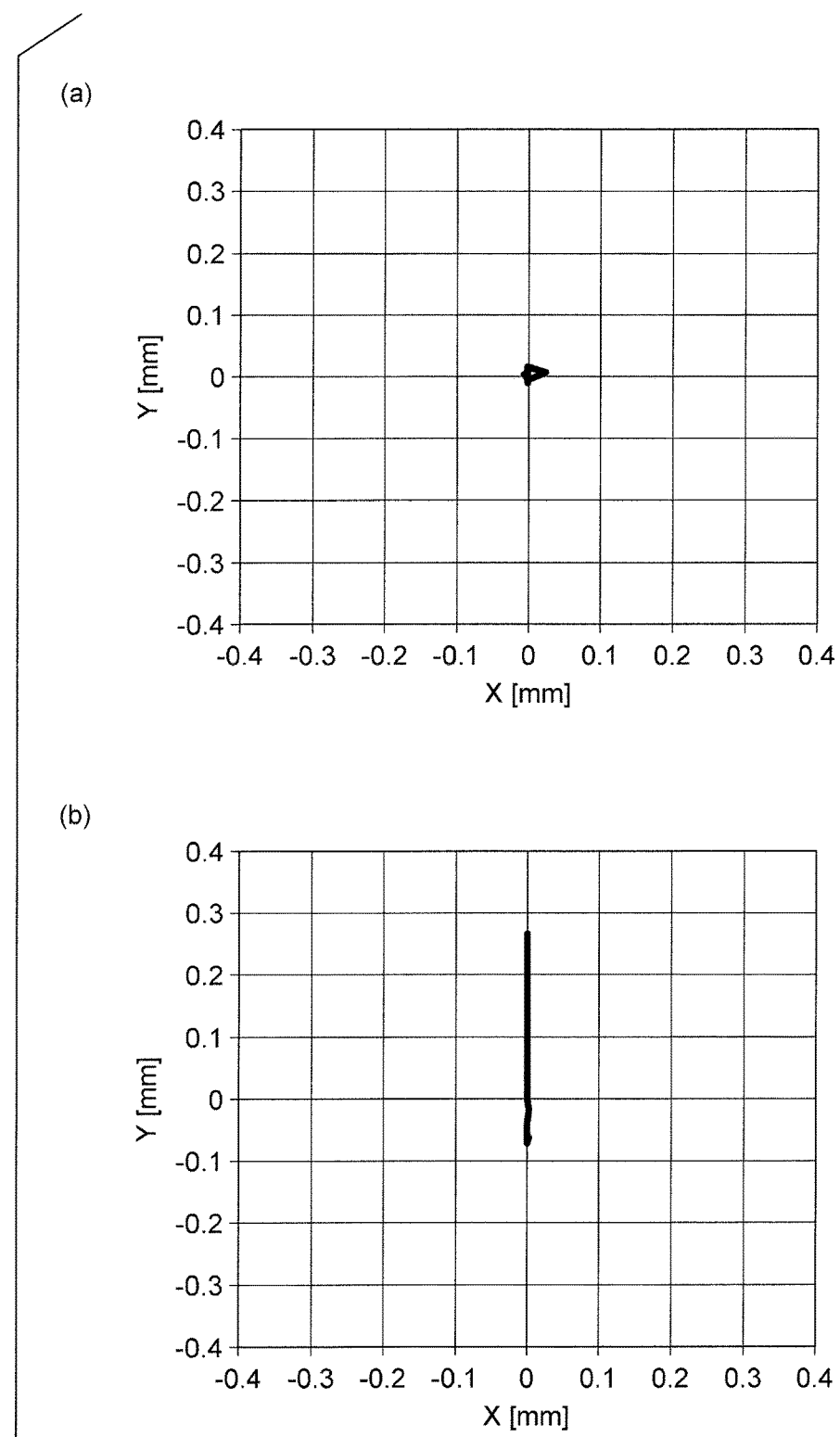
FIG. 8 is a graph showing, by way of example, a trajectory of a first position of a center of gravity, during the heat treatment.

FIG. 8(a) is a graph showing the trajectory of the position of the thermal center of gravity calculated by using the temperatures shown in FIG. 7(a). FIG. 8(b) is a graph showing the trajectory of the position of the thermal center of gravity calculated by using the temperatures shown in FIG. 7(b). The up and down direction and the right and left direction in FIGS. 8(a) and 8(b) correspond to the up and down direction and the right and left direction in FIG. 5, respectively. In FIG. 8 (b), the position of the thermal center of gravity largely varies upward as compared with that of FIG. 8(a). This may be because the wafer W floats up in the upper part of the drawings, whereby lowering of the temperature upon placement of the wafer W is smaller in the upper part of the drawings.

As shown by FIG. 8, the position of the thermal center of gravity sensitively varies depending on partial anomaly of heat treatment condition. Thus, the partial anomaly of heat treatment condition can be sensitively detected based on the position of the thermal center of gravity. Thus, the anomaly of heat treatment condition can be more reliably detected.

In addition to the calculation of the position of the thermal center of gravity in a plane parallel to the wafer W as the position of the first thermal center of gravity, the control section 100 may further calculate, as the position of a second thermal center of gravity, the position of the thermal center of gravity with respect to the radial direction of the wafer W, and may detect heat treatment condition of the wafer W based on the positions of the first and second center of gravity.

The heating plate 20 shown in FIG. 5 is divided into three areas 20a, 20b and 20c that are concentric with the wafer W and arranged in the radial direction thereof. Since the area 20b is composed of two sub-areas that are arranged in the circumferential direction (angular direction), the two temperature sensors 40 are disposed on the area 20b. Since the area 20c is composed of four sub-areas that are arranged in the circumferential direction, the four temperature sensors 40 are disposed on the area 20c. In this case, the second position of the thermal center of gravity can be calculated by the following expression, by regarding temperature Ta detected by the temperature sensor 40 in the area 20a as a weight of the area 20a, by regarding the average value Tb of temperatures detected by the two temperature sensors 40 in the area 20b as a weight of the area 20b, and by regarding the average value Tc of temperatures detected by the four temperature sensors 40 in the area 20c as a weight of the areas 20.

$$R=(ra \cdot Ta+rb \cdot Tb+rc \cdot Tc)/(Ta+Tb+Tc)$$

where:
R: the position of the second center of gravity;
ra: the radial position of the area 20a (the distance from the center of the wafer W to the area 20a);
rb: the radial position of the area 20b (the distance from the center of the wafer W to the area 20b);
rc: the radial position of the area 20c (the distance from the center of the wafer W to the area 20c);
Ta: the temperatures detected by the temperature sensor 40 in the area 20a;
Tb: the average value of temperatures detected by the two temperature sensors 40 in the area 20b; and
Tc: the average value of temperatures detected by the four temperature sensors 40 in the area 20c.

Although the position of the first thermal center of gravity sensitively changes depending on partial anomaly of heat treatment condition, the position of the first thermal center of gravity is unlikely to change in the case of anomaly of heat treatment condition where the temperature distribution is point-symmetric with respect to the center the wafer W. Concrete examples of the cases causing such anomaly include a case where a central portion of the wafer W floats up because of particles therebelow, and a case where a wafer warps so that the entire peripheral portion of the wafer W floats up uniformly, etc.

Figure 9:
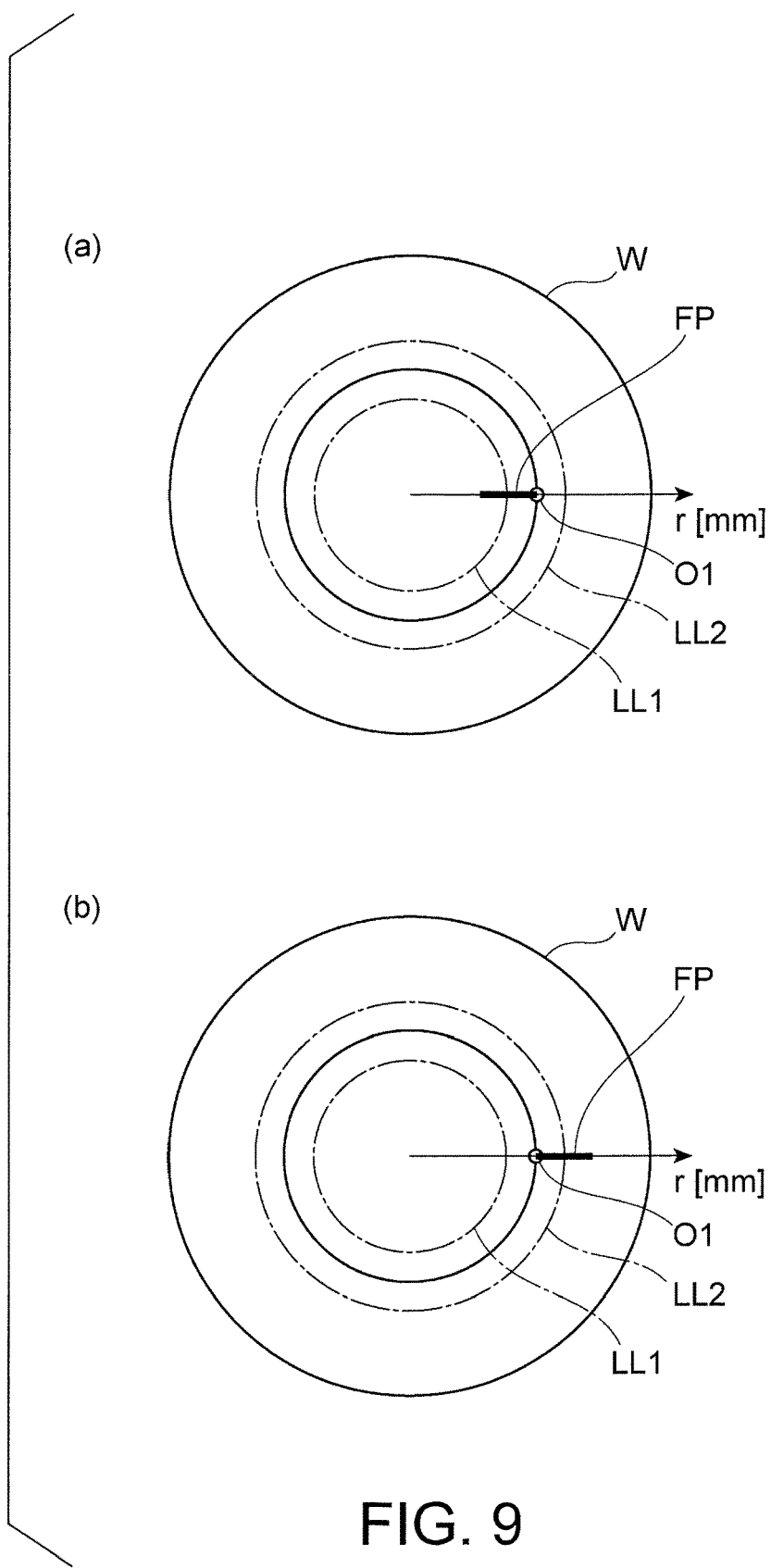
FIG. 9 is a graph showing, by way of example, a trajectory of a second position of a center of gravity, during the heat treatment.

On the other hand, the position of the second thermal center of gravity changes depending on the temperature distribution along the radial direction of a wafer W. FIG. 9 is a graph showing the trajectory of the position of the second center of gravity during heat treatment. The r-axis therein indicates the radial position (radius or r-coordinate value) in a circular polar coordinate system having its pole at the center of the wafer W. Reference sign "FP" depicts the trajectory of the second position of the thermal center of gravity. Reference sign "O1" depicts the intermediate position between the center of the wafer W and the periphery (edge) of the wafer W. FIG. 9(a) shows that the central portion of the wafer W floats up. In this case, the trajectory FP largely deviates toward the center of the wafer W relative to the intermediate position O1. FIG. 9(b) shows that the peripheral portion of the wafer W floats up. In this case, the trajectory FP is largely deviates toward the periphery of the wafer W. As can be seen, the position of the second thermal center of gravity can sensitively move when the temperature distribution is point-symmetric with respect to the center of the wafer W. Thus, by detecting heat treatment condition of the wafer W (substrate) based both on the positions of the first and second thermal center of gravity, anomaly of heat treatment condition can be more reliably detected.

As described above, the control section 100 may calculate the position of the second thermal center of gravity, by regarding the average value of the temperature data detected by the temperature sensors having the same radial position (r-coordinate value), as only one temperature datum (weight) for the radial position. The control section 100 may calculate the position of the second thermal center of gravity, by regarding the average value of the temperature data detected by the temperature sensors disposed in each of the annular areas 20a, 20b and 20c (which areas are concentric with the wafer W and arranged in different radial positions) as only one temperature datum (weight) in that annular area. In these cases, the second position of the thermal center of gravity can be calculated precisely.

The control section 100 is configured to use the reference position that is determined based on the position of the thermal center of gravity when the wafer W is normally heat-treated, and configured to detect the heat treatment condition of the wafer W based on a difference between the position of the thermal center of gravity and the reference position. Thus, the heat treatment condition of the wafer W is detected based on a component (e.g., X-direction component value or Y-direction component)) remote from the reference position. Since the judgment is made based on the component remote from the reference position, the judgmental standard for judging whether the heat treatment condition is normal or abnormal can be simplified.

It is sufficient that the control section 100 is configured to detect the heat treatment condition based on the position of the thermal center of gravity, and it is not absolutely necessary for the control section 100 to use the reference position.

The control section 100 is configured to use, as the reference position, the average value of positions of the thermal center of gravity, which are calculated in normal heat treatments of plural times, and configured to use the allowable range determined based on the standard deviation of the positions of the thermal center of gravity, which are calculated in normal heat treatments of plural times. When the difference between the position of the thermal center of gravity and the reference position is out of the allowable range, the control section 100 is configured to judge that the heat treatment condition the wafer W is abnormal.

Figure 10:
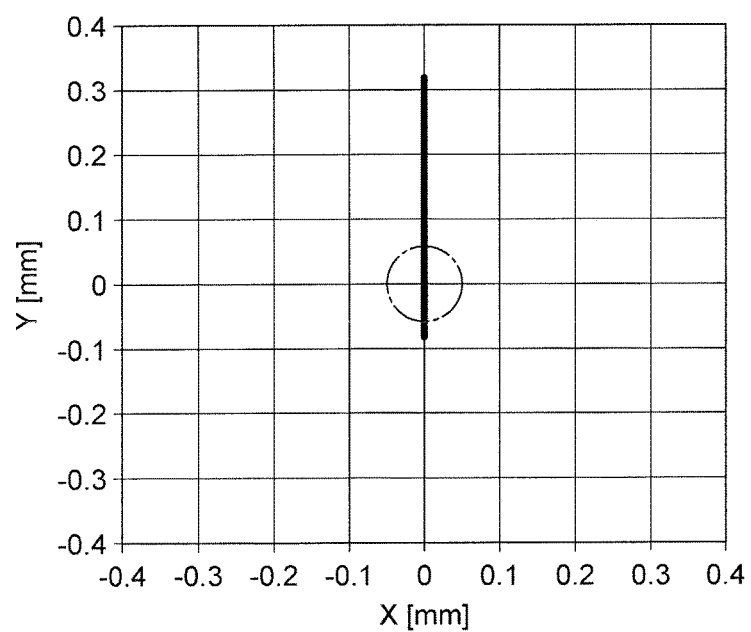
FIG. 10 is a graph showing, by way of example, a trajectory difference between a position of a thermal center of gravity and a reference position, during heating.

FIG. 10 is a graph showing a trajectory of the difference between the position of the thermal center of gravity shown in FIG. 8(b) and the reference position. One-dot chain lines in FIG. 9 show the allowable range. Once the trajectory in FIG. 9 deviates from the area defined by the one-dot chain lines, there is detected that the heat treatment condition of the wafer W is abnormal. Namely, based on the simple reference as to whether or not the position of the thermal center of gravity is positioned within the allowable range, anomaly of the heat treatment condition can be detected. In addition, since the average value is used as the reference value, and the allowable range determined based on the standard deviation is used, allowable variation is tolerated so that the frequency of improper anomaly detection is reduced.

When the difference between the position of the second thermal center of gravity and the reference position is out of the allowable range, the heat treatment condition of a wafer W can be also determined as abnormal. The two-dot chain lines LL1 and LL2 in FIG. 9 show the allowable range of the second reference position.

It is sufficient that the control section 100 is configured to detect the heat treatment condition based on the position of the thermal center of gravity, and a concrete method for detecting the heat treatment condition based on the position of the thermal center of gravity is not limited to the above method.

The control section 100 is configured to output information related to the position of the thermal center of gravity. It is possible to know in which direction anomaly of heat treatment condition occurs, based on the position of the thermal center of gravity. Thus, by outputting information related to the position of the thermal center of gravity, there can be provided information which is useful to identify a position at which anomaly of heat treatment condition is caused.

It is sufficient that the control section 100 is configured to detect a heat treatment condition, it is not absolutely necessary that the control section 100 is configured to output information related to a position of a thermal center of gravity.

The control section 100 is configured to output the trajectory information of the difference between the position of the thermal center of gravity and the reference position, as an example of information related to the position of the thermal center of gravity. Thus, the control section 100 outputs trajectory information of the component remote from the reference position, among the positions of the thermal center of gravity. It is possible to more easily know in which direction anomaly of heat treatment condition occurs, based on the trajectory information of the component remote from the reference position. Thus, there can be provided information which is useful to identify the position at which anomaly of heat treatment condition is caused. For example, based on FIG. 9, it is possible to estimate that the wafer W floats up in the upper part of FIG. 5.

The control section 100 may be configured to output, as information related to the position of the thermal center of gravity, the trajectory information of position of the thermal center of gravity and trajectory information of the reference positions in an overlapped manner, or may be configured to output information showing the direction in which anomaly supposedly occurs. The control section 100 may be configured to output, as information related to the position of the thermal center of gravity, only trajectory information of the position of the thermal center of gravity themselves.

The heaters 21 in each of the treatment areas (areas 20a, 20b and 20c) arranged in a plane of the wafer W may be controllable independently from the other treatment area; and the control unit 100 may be further configured to identify a treatment area in which the heat treatment is insufficient based on the position of the thermal center of gravity, and to control the heat treatment unit in order to promote the heat treatment in the treatment area. In this case, since the heat treatment is performed depending on the information of the position of the thermal center of gravity, reliability of the heat treatment can be improved. A concrete example of the heat treatment procedure including promoting of heat treatment in a treatment area in which heat treatment is insufficient is described with reference to FIG. 11.

Figure 11:
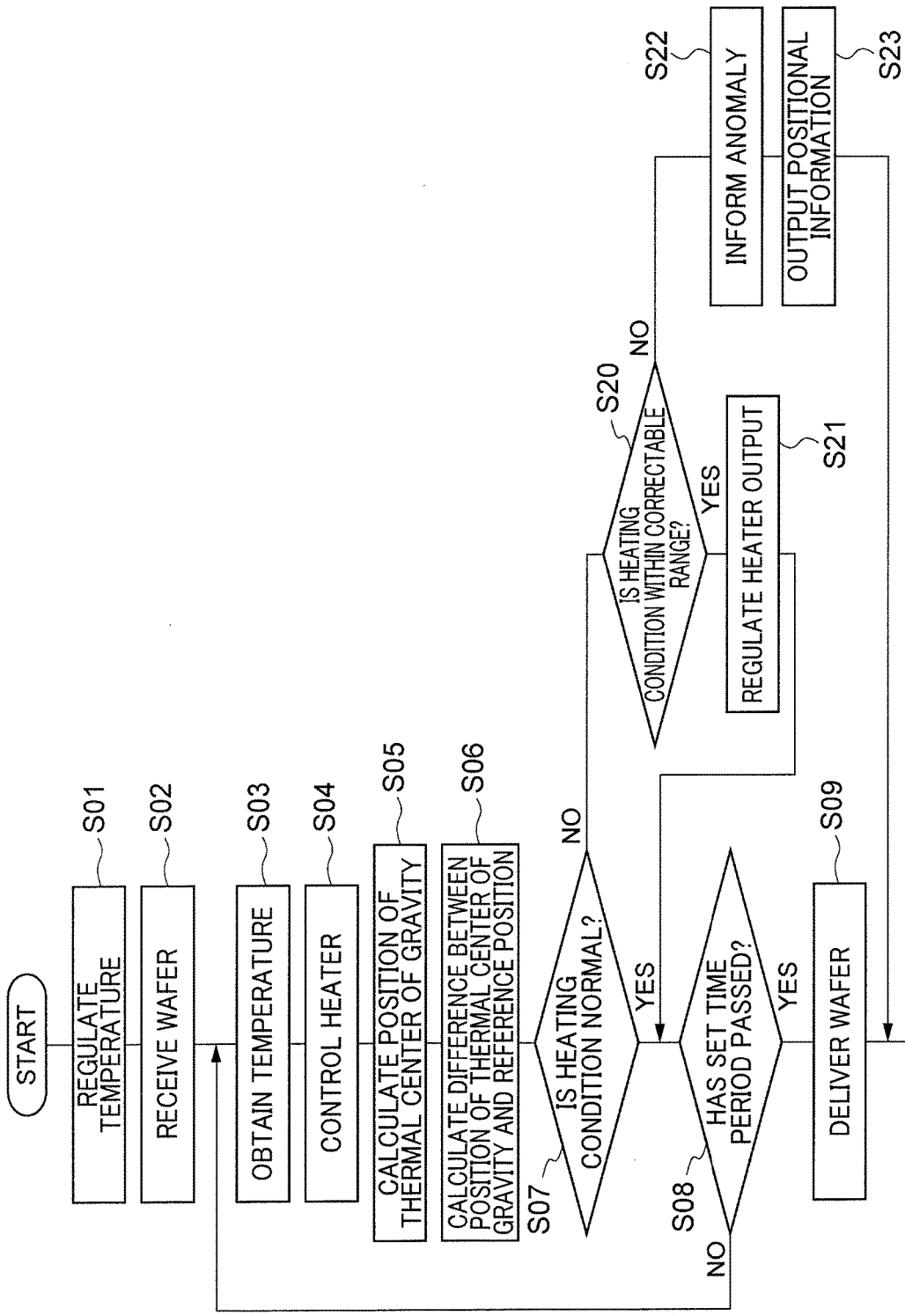
FIG. 11 is a flowchart showing a modification example of the heat treatment procedure.

In the heat treatment procedure shown in FIG. 11, when the fact that heat treatment condition is abnormal is detected in the step S07, the control section 100 performs a step S20. In the step S20, the heater control unit 112 judges whether or not the anomaly of the heat treatment condition is within the allowable range. For example, the heater control unit 112 judges whether or not the temperature of the treatment area in which the heat treatment is insufficient is within a correctable range. The correctable range is a range from which the temperature can be corrected to the allowable range, by adjusting the output of the heater 21. The correctable range can be determined beforehand through an experiment.

In the step S20, if it is judged that the anomaly of the heat treatment condition is within the correctable range, the control section 100 performs a step S21. In the step S21, the heater control unit 112 controls the heaters 21 such that the heat treatment in the treatment area in which the heat treatment is insufficient is promoted. For example, the heater control unit 112 increases the output of the heater(s) 21 in the treatment area in which the heat treatment is insufficient. Thereafter, the program proceeds to the step S08 by the control section 100.

In the step S20, when the anomaly of the heat treatment condition is judged to be out of the correctable range, the control section 100 performs steps S22 and S23, similarly to the steps S10 and S11, and then finishes the process.

The present invention is not limited to the aforementioned embodiment, and may be variously modified without departing from the scope thereof. For example, the heat treatment unit for heating a wafer W on the placement unit is not limited to the aforementioned heaters 21, but may be infrared light sources configured to heat a wafer W by radiation. The object of the heat treatment unit is not limited to heating. For example, the heat treatment unit may be a cooler for cooing a wafer W. The object to be heat-treated is not limited to a semiconductor wafer, and may be a glass substrate, a mask substrate or an FPD (Flat Panel Display).

What is claimed is:

1. A substrate heat treatment apparatus comprising:
a placement unit on which a substrate is placed;
a heat treatment unit for heating or cooling the substrate on the placement unit;
a plurality of temperature sensors positioned correspondingly to a plurality of locations of the substrate on the placement unit; and
a control unit configured to control the heat treatment unit based on temperatures detected by the temperature sensors, configured to calculate a position of a thermal center of gravity of the substrate based on the temperatures detected by the temperature sensors, and configured to detect heat treatment condition of the substrate based on the position of the thermal center of gravity, the thermal center of gravity corresponding to a center of gravity on the assumption that the temperatures detected by the temperature sensors are regarded as weights,
wherein the control unit is configured to use a reference position that is determined based on the position of the thermal center of gravity when the substrate is normally heat-treated, and to detect the heat treatment condition of the substrate based on a difference between the position of the thermal center of gravity and the reference position.

2. The substrate heat treatment apparatus according to claim 1, wherein the control unit is configured to calculate, as a first position of a thermal center of gravity, the position of the thermal center of gravity in a plane of the substrate, configured to calculate, as a second position of a thermal center of gravity, the position of the thermal center of gravity in a radial position of the substrate, and configured to detect the heat treatment condition of the substrate based on the first and second positions of the thermal center of gravity.

3. The substrate heat treatment apparatus according to claim 2, wherein the control unit is configured to calculate the second position of the thermal center of gravity, by regarding an average value of the temperature data detected by the temperature sensors whose radial positions are identical to each other, as only one temperature datum at the corresponding radial position.

4. The substrate heat treatment apparatus according to claim 2, wherein the control unit is configured to calculate the second position of the thermal center of gravity, by regarding an average value of the temperature data detected by the temperature sensors in each of annular areas, which are concentric with the substrate and arranged in different radial positions, as only one temperature datum in the annular area.

5. The substrate heat treatment apparatus according to claim 1, wherein the control unit is configured to use, as the reference position, an average value of the positions of the thermal center of gravity, which is calculated in normal heat treatments of plural times, configured to further use an allowable range determined based on a standard deviation of the positions of the thermal center of gravity, which is calculated in normal heat treatments of plural times, and configured to detect that the heat treatment condition of the substrate is abnormal when a difference between the position of the thermal center of gravity and the reference position is out of the allowable range.

6. The substrate heat treatment apparatus according to claim 1, wherein the control unit is configured to further output information related to the position of the thermal center of gravity.

7. The substrate heat treatment apparatus according to claim 1, wherein the control unit is configured to further output trajectory information of a difference between the position of the thermal center of gravity and the reference position.

8. The substrate heat treatment apparatus according to claim 1, wherein
the heat treatment unit is capable of independently controlling the heat treatment condition of a plurality of treatment areas arranged in a plane of the substrate; and
the control unit is configured to identify a treatment area in which the heat treatment is insufficient based on the position of the thermal center of gravity, and configured to control the heat treatment unit in order to promote the heat treatment in the treatment area.

9. A substrate heat treatment apparatus comprising:
a placement unit on which a substrate is placed;
a heat treatment unit for heating or cooling the substrate on the placement unit;
a plurality of temperature sensors positioned correspondingly to a plurality of locations of the substrate on the placement unit; and
a control unit configured to control the heat treatment unit based on temperatures detected by the temperature sensors, configured to calculate a position of a thermal center of gravity of the substrate based on the temperatures detected by the temperature sensors, and configured to detect heat treatment condition of the substrate based on the position of the thermal center of gravity, the thermal center of gravity corresponding to a center of gravity on the assumption that the temperatures detected by the temperature sensors are regarded as weights,
wherein the control unit is configured to calculate, as a first position of a thermal center of gravity, the position of the thermal center of gravity in a plane of the substrate, configured to calculate, as a second position of a thermal center of gravity, the position of the thermal center of gravity in a radial position of the substrate, and configured to detect the heat treatment condition of the substrate based on the first and second positions of the thermal center of gravity, and
wherein the control unit is configured to calculate the second position of the thermal center of gravity, by regarding an average value of the temperature data detected by the temperature sensors whose radial positions are identical to each other, as only one temperature datum at the corresponding radial position.

10. A substrate heat treatment apparatus comprising:
a placement unit on which a substrate is placed;
a heat treatment unit for heating or cooling the substrate on the placement unit;
a plurality of temperature sensors positioned correspondingly to a plurality of locations of the substrate on the placement unit; and
a control unit configured to control the heat treatment unit based on temperatures detected by the temperature sensors, configured to calculate a position of a thermal center of gravity of the substrate based on the temperatures detected by the temperature sensors, and configured to detect heat treatment condition of the substrate based on the position of the thermal center of gravity, the thermal center of gravity corresponding to a center of gravity on the assumption that the temperatures detected by the temperature sensors are regarded as weights,
wherein the control unit is configured to calculate, as a first position of a thermal center of gravity, the position of the thermal center of gravity in a plane of the substrate, configured to calculate, as a second position of a thermal center of gravity, the position of the thermal center of gravity in a radial position of the substrate, and configured to detect the heat treatment condition of the substrate based on the first and second positions of the thermal center of gravity, and
wherein the control unit is configured to calculate the second position of the thermal center of gravity, by regarding an average value of the temperature data detected by the temperature sensors in each of annular areas, which are concentric with the substrate and arranged in different radial positions, as only one temperature datum in the annular area.

11. A substrate heat treatment apparatus comprising:
a placement unit on which a substrate is placed;
a heat treatment unit for heating or cooling the substrate on the placement unit;
a plurality of temperature sensors positioned correspondingly to a plurality of locations of the substrate on the placement unit; and
a control unit configured to control the heat treatment unit based on temperatures detected by the temperature sensors, configured to calculate a position of a thermal center of gravity of the substrate based on the temperatures detected by the temperature sensors, and configured to detect heat treatment condition of the substrate based on the position of the thermal center of gravity, the thermal center of gravity corresponding to a center of gravity on the assumption that the temperatures detected by the temperature sensors are regarded as weights,
wherein the control unit is configured to calculate the position of the thermal center of gravity by the following expressions (1) and (2):

$$X = \frac{\sum_{i=1}^{n} xi \cdot Ti}{\sum_{i=1}^{n} Ti} \tag{1}$$

$$Y = \frac{\sum_{i=1}^{n} yi \cdot Ti}{\sum_{i=1}^{n} Ti} \tag{2}$$

where:
"X" and "Y" are coordinate values indicating the position of the thermal center of gravity in orthogonal coordinate system;
"xi" and "yi" are coordinate values indicating the position of the temperature sensor in the orthogonal coordinate system;
"Ti" is the temperature detected by each of the temperature sensors; and
"n" is the number of the temperature sensors.

12. A substrate heat treatment method comprising:
placing a substrate on a placement unit;
heating or cooling the substrate on the placement unit by a heat treatment unit;
detecting temperatures by a plurality of temperature sensors positioned correspondingly to a plurality of locations of the substrate on the placement unit;
controlling the heat treatment unit based on the temperatures detected by the temperature sensors;
calculating a position of a thermal center of gravity based on the temperatures detected by the temperature sensors, the thermal center of gravity corresponding to a center of gravity on the assumption that the temperatures detected by the temperature sensors are regarded as weights; and
detecting heat treatment condition of the substrate based on the position of the thermal center of gravity,
wherein:
a reference position is used, which is determined based on the position of the thermal center of gravity when the substrate is normally heat-treated; and
the heat treatment condition of the substrate is detected based on a difference between the position of the thermal center of gravity and the reference position.

13. The substrate heat treatment method according to claim 12, wherein:
an average value of the positions of the thermal center of gravity, which is calculated in normal heat treatments of plural times, is used as the reference position;
an allowable range determined based on a standard deviation of the positions of the thermal center of gravity, which is calculated in normal heat treatments of plural times, is further used; and
when a difference between the position of the thermal center of gravity and the reference position is out of the allowable range, the heat treatment condition of the substrate is detected as abnormal.

14. The substrate heat treatment method according to claim 12, further comprising outputting information related to the position of the thermal center of gravity.

15. The substrate heat treatment method according to claim 11, further comprising outputting trajectory information of a difference between the position of the thermal center of gravity and the reference position.

16. The substrate heat treatment method according to claim 12, further comprising:
identifying a treatment area in which the heat treatment is insufficient based on the position of the thermal center of gravity; and
controlling the heat treatment unit in order to promote the heat treatment in the treatment area.

17. A substrate heat treatment method comprising:
placing a substrate on a placement unit;
heating or cooling the substrate on the placement unit by a heat treatment unit;
detecting temperatures by a plurality of temperature sensors positioned correspondingly to a plurality of locations of the substrate on the placement unit;
controlling the heat treatment unit based on the temperatures detected by the temperature sensors;
calculating a position of a thermal center of gravity based on the temperatures detected by the temperature sensors, the thermal center of gravity corresponding to a center of gravity on the assumption that the temperatures detected by the temperature sensors are regarded as weights; and
detecting beat treatment condition of the substrate based on the position of the thermal center of gravity,
wherein:
the position of the thermal center of gravity in a plane of the substrate is calculated as a first position of a thermal center of gravity;
the position of the thermal center of gravity in a radial position of the substrate is calculated as a second position of a thermal center of gravity;
the heat treatment condition of the substrate is detected based on the first and second positions of the thermal center of gravity; and
the second position of the thermal center of gravity is calculated by regarding an average value of the temperature data detected by the temperature sensors whose radial positions are identical to each other, as only one temperature datum at the corresponding radial position.

18. A substrate heat treatment method comprising:
placing a substrate on a placement unit;
heating or cooling the substrate on the placement unit by a heat treatment unit;
detecting temperatures by a plurality of temperature sensors positioned correspondingly to a plurality of locations of the substrate on the placement unit;
controlling the heat treatment unit based on the temperatures detected by the temperature sensors;
calculating a position of a thermal center of gravity based on the temperatures detected by the temperature sensors, the thermal center of gravity corresponding to a center of gravity on the assumption that the temperatures detected by the temperature sensors are regarded as weights; and
detecting heat treatment condition of the substrate based on the position of the thermal center of gravity,
wherein:
the position of the thermal center of gravity in a plane of the substrate is calculated as a first position of a thermal center of gravity;
the position of the thermal center of gravity in a radial position of the substrate is calculated as a second position of a thermal center of gravity;
the heat treatment condition of the substrate is detected based on the first and second positions of the thermal center of gravity; and
the second position of the thermal center of gravity is calculated by regarding an average value of the temperature data detected by the temperature sensors in each of annular areas, which are concentric with the substrate and arranged in different radial positions, as only one temperature datum in the annular area.

19. A substrate heat treatment method comprising:
placing a substrate on a placement unit;
heating or cooling the substrate on the placement unit by a heat treatment unit;
detecting temperatures by a plurality of temperature sensors positioned correspondingly to a plurality of locations of the substrate on the placement unit;
controlling the heat treatment unit based on the temperatures detected by the temperature sensors;
calculating a position of a thermal center of gravity based on the temperatures detected by the temperature sensors, the thermal center of gravity corresponding to a center of gravity on the assumption that the temperatures detected by the temperature sensors are regarded as weights; and detecting heat treatment condition of the substrate based on the position of the thermal center of gravity, wherein the control unit is configured to calculate the position of the thermal center of gravity by the following expressions (1) and (2):

$$X = \frac{\sum_{i=1}^{n} xi \cdot Ti}{\sum_{i=1}^{n} Ti} \quad (1)$$

$$Y = \frac{\sum_{i=1}^{n} yi \cdot Ti}{\sum_{i=1}^{n} Ti} \quad (2)$$

where:

"X" and "Y" are coordinate values indicating the position of the thermal center of gravity in orthogonal coordinate system;

"xi" and "yi" are coordinate values indicating the position of the temperature sensor in the orthogonal coordinate system;

"Ti" is the temperature detected by each of the temperature sensors; and

"n" is the number of the temperature sensors.

20. A computer-readable recording medium recording a program for causing an apparatus to execute the substrate heat treatment method according to claim 12.

* * * * *